US008907369B2

(12) United States Patent
Zitzlsperger et al.

(10) Patent No.: US 8,907,369 B2
(45) Date of Patent: Dec. 9, 2014

(54) OPTOELECTRONIC SEMICONDUCTOR COMPONENT

(75) Inventors: Michael Zitzlsperger, Regensburg (DE); Johann Ramchen, Altdorf (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 13/818,021

(22) PCT Filed: Aug. 18, 2011

(86) PCT No.: PCT/EP2011/064224
§ 371 (c)(1),
(2), (4) Date: Apr. 23, 2013

(87) PCT Pub. No.: WO2012/022782
PCT Pub. Date: Feb. 23, 2012

(65) Prior Publication Data
US 2013/0200405 A1 Aug. 8, 2013

(30) Foreign Application Priority Data
Aug. 20, 2010 (DE) .......................... 10 2010 034 924

(51) Int. Cl.
*H01L 33/00* (2010.01)
*H01L 33/64* (2010.01)
*H01L 33/48* (2010.01)
*H01L 33/62* (2010.01)
*F21V 29/00* (2006.01)

(52) U.S. Cl.
CPC .............. *H01L 33/64* (2013.01); *H01L 33/486* (2013.01); *H01L 33/62* (2013.01); *F21V 29/002* (2013.01); *H01L 2224/48247* (2013.01); *H01L 2224/48471* (2013.01)
USPC .......................................................... 257/99

(58) Field of Classification Search
CPC ....... H01L 33/486; H01L 33/62; H01L 33/64; H01L 2224/48247; H01L 2224/48471; H01L 2224/48227; H01L 2924/00; F21V 29/30
USPC .............. 257/88, 98, 99; 362/249.01, 249.02, 362/382, 555
See application file for complete search history.

(56) References Cited

U.S. PATENT DOCUMENTS

| 3,671,819 | A | 6/1972 | Swanson |
| 7,268,014 | B2 * | 9/2007 | Lee et al. ....................... 438/106 |
| 2007/0023893 | A1 | 2/2007 | Shin et al. |

(Continued)

FOREIGN PATENT DOCUMENTS

| JP | 2003310753 A | 11/2003 |
| JP | 2007251167 A | 9/2007 |

*Primary Examiner* — Nikolay Yushin
(74) *Attorney, Agent, or Firm* — Slater & Matsil, L.L.P.

(57) ABSTRACT

An optoelectronic semiconductor component includes a substrate that has an upper side and an under side lying opposite the upper side. The substrate is formed with an electrically conductive mounting region, an electrically conductive connection region and an electrically isolating oxidation region. An optoelectronic part is arranged on the upper side of the substrate in the region of the mounting region. The oxidation region electrically isolates the mounting region from the connection region. The oxidation region extends, without interruption, from the upper side of the substrate to the underside of the substrate. The mounting region and the connection region are formed with aluminum and the oxidation region is formed with an oxide of the aluminum. The mounting region, the oxidation region and the connection region being are designed contiguously to form an entity.

14 Claims, 4 Drawing Sheets

(56) References Cited

U.S. PATENT DOCUMENTS

| | | |
|---|---|---|
| 2007/0029570 A1 | 2/2007 | Shin et al. |
| 2007/0080360 A1 | 4/2007 | Mirsky et al. |
| 2007/0221928 A1 | 9/2007 | Lee et al. |
| 2009/0252950 A1 | 10/2009 | Liaw et al. |
| 2009/0261356 A1 | 10/2009 | Lee et al. |
| 2010/0133557 A1 | 6/2010 | Kwon et al. |

* cited by examiner

OPTOELECTRONIC SEMICONDUCTOR COMPONENT

This patent application is a national phase filing under section 371 of PCT/EP2011/064224, filed Aug. 18, 2011, which claims the priority of German patent application 10 2010 034 924.0, filed Aug. 20, 2010, each of which is incorporated herein by reference in its entirety.

TECHNICAL FIELD

An optoelectronic semiconductor component is specified.

SUMMARY OF THE INVENTION

Embodiments specify an optoelectronic semiconductor component which is space-saving and compact in its construction.

In accordance with at least one embodiment of the optoelectronic semiconductor component, the latter comprises a carrier having a top side and an underside situated opposite the top side. A respective area formed by a part of the outer area of the carrier is formed at the top side and the underside. The area at the underside is the part of the outer areas of the carrier which faces a contact carrier—for example a circuit board—in the mounted state of the carrier. By way of example, the area at the underside of the carrier is a mounting area that can serve for the mounting of the later semiconductor component on the contact carrier. An area at the underside of the semiconductor component can be formed at least in places by the area at the underside of the carrier.

The carrier is formed with an electrically conductive mounting region, an electrically conductive connection region and also an electrically insulating oxidation region. That is to say that the carrier comprises the three regions, wherein the oxidation region differs from the mounting region and the connection region at least with regard to its material. That is to say that the material of the oxidation region is not identical to the material of the mounting region and/or of the connection region. In this context, "region" is any three-dimensional structure which shapes and forms the carrier at least in places. By way of example, the connection region, the mounting region and the oxidation region completely form the carrier.

In accordance with at least one embodiment, the optoelectronic semiconductor component comprises at least one optoelectronic element arranged at the top side of the carrier in the region of the mounting region. The optoelectronic element can be, in particular, a radiation-receiving or a radiation-emitting semiconductor chip. By way of example, the semiconductor chip is a luminescence diode chip, that is to say a light-emitting diode chip or a laser diode chip. By way of example, the optoelectronic element is bonded, soldered or electrically conductively adhesively bonded by an outer area onto a contact place of the carrier in the mounting region.

In accordance with at least one embodiment, the oxidation region electrically insulates the mounting region from the connection region. That is to say that for example during proper use of the semiconductor component, proceeding from the mounting region, there is no electrically conductive connection through the oxidation region into the connection region, and vice versa.

In accordance with at least one embodiment, the oxidation region extends without interruption from the top side of the carrier toward the underside of the carrier. That is to say that at least one imaginary line or path which connects the top side and the underside to one another runs through the carrier and is arranged completely in the oxidation region.

In accordance with at least one embodiment, the mounting region and the connection region are formed with aluminum. By way of example, the mounting region and the connection region are formed completely with the aluminum. For example, the carrier is an aluminum plate which is partially oxidized in order to produce the oxidation region. The non-oxidized regions can then form the mounting region and/or the connection region. It has been found that aluminum is particularly suitable for making contact with the optoelectronic element and, moreover, heat generated by the optoelectronic element can be dissipated from the latter. Therefore, the optoelectronic element can be sufficiently cooled by means of the aluminum.

In accordance with at least one embodiment, the oxidation region is formed with an oxide of the aluminum. By way of example, the oxide is $Al_xO_y$. For example, $x=2$ and $y=3$. Preferably, such an oxide is electrically insulating and additionally has a high thermal conductivity. Advantageously, heat generated by the optoelectronic element can be dissipated from the optoelectronic element through the oxidation region and can be distributed for example uniformly over the entire carrier.

In accordance with at least one embodiment, the mounting region, the oxidation region and the connection region are embodied in a contiguous fashion and form one unit. Preferably, in this case the individual regions merge directly into one another, such that neither a gap nor an interruption forms between the individual regions.

In accordance with at least one embodiment of the optoelectronic semiconductor component, the latter comprises a carrier having a top side and an underside situated opposite the top side, wherein the carrier is formed with an electrically conductive mounting region, an electrically conductive connection region and also an electrically insulating oxidation region. Furthermore, at least one optoelectronic element is arranged at the top side of the carrier in the region of the mounting region. The oxidation region electrically insulates the mounting region from the connection region, wherein the oxidation region extends without interruption from the top side of the carrier toward the underside of the carrier. The mounting region and the connection region are formed with an aluminum, wherein the oxidation region is formed with an oxide of the aluminum. Furthermore, the mounting region, the oxidation region and the connection region are embodied in a contiguous fashion and form one unit.

In accordance with at least one embodiment, the optoelectronic semiconductor component comprises at least one further oxidation region formed at the underside of the carrier in the region of the mounting region and/or of the connection region, wherein the further oxidation region does not completely form the carrier at any place in a vertical direction. That is to say that the further oxidation region can be introduced from outside into the carrier via the underside of the carrier, for example, and forms only a marginal region of the carrier at the underside of the carrier. For example, the area at the underside of the carrier is formed in places by the further oxidation region.

In particular, the further oxidation region does not form a unit with other oxidation regions of the carrier. The further oxidation region is then separated from other oxidation regions of the carrier for example by non-oxidized regions of the carrier.

The further oxidation region extends for example on the underside of the carrier in the region of the radiation-emitting semiconductor chip. That is to say that the further oxidation region can be situated oppositely with respect to the radiation-emitting semiconductor chip at the underside of the carrier and comprises at least one projection of that surface of the semiconductor chip which faces the carrier onto the underside of the carrier.

In accordance with at least one embodiment, the further oxidation region has a maximum thickness corresponding at most to 25% of the thickness of the carrier. In this case, thickness is understood to be the extent of the carrier in a vertical direction. In other words, the oxidation region is designed to be thin in comparison with the carrier.

In accordance with at least one embodiment, the oxidation region is arranged at least in places between the mounting region and the connection region in a lateral direction. By way of example, the oxidation region spaces apart the mounting region from the connection region in a lateral direction. "Lateral direction" is a direction parallel to the main extension direction of the carrier. The oxidation region can be a spacer between the mounting region and the connection region.

In accordance with at least one embodiment, the oxidation region borders the mounting region and/or the connection region at least in places. It is possible for the oxidation region to border the mounting region and/or the connection region completely, for example in a frame-shaped fashion, and to enclose said region(s) in a lateral direction. By way of example, the oxidation region forms an edge region of the carrier in places or completely.

In accordance with at least one embodiment, the mounting region and/or the connection region border(s) the oxidation region at least in places. In this context, it is conceivable for the oxidation region to completely border the connection region, for example, wherein the oxidation region can in turn be completely bordered by the mounting region. By way of example, the mounting region then forms the edge region of the carrier.

In accordance with at least one embodiment, a thickness of the carrier is at least 0.1 mm and at most 0.4 mm. In this context, "thickness" means an extent of the carrier in a vertical direction. In this case, "vertical direction" means a direction perpendicular to the main extension direction of the carrier. Such a thickness of the carrier leads to an optoelectronic semiconductor component having a particularly small vertical extent. In other words, the optoelectronic semiconductor component is particularly flat.

In accordance with at least one embodiment, the optoelectronic semiconductor component comprises connection places which are arranged at the underside of the carrier in the mounting region and in the connection region and which do not project beyond the carrier in a lateral direction. That is to say that the connection locations are not led away from the carrier in a lateral direction and are not led out laterally from the semiconductor component. By way of example, connection areas of the connection places form at least in places an area at the underside of the semiconductor component via which electrical contact can be made with them externally outside the semiconductor component. The connection places serve for making electrical contact with the optoelectronic element.

In accordance with at least one embodiment, the carrier is covered by a housing body at least in places. In this context, "covered" means that the housing body is in direct contact with the carrier in places and so neither a gap nor an interruption forms at the places between the carrier and the housing body. Advantageously, the housing body increases the stability of the semiconductor component against external mechanical loads such as can occur during proper use of the semiconductor component. In particular, the housing body stabilizes the carrier, such that deformation and/or damage of the carrier can be avoided during the production of the carrier and/or of the semiconductor component or during the operation of the semiconductor component. A deformation of the carrier can therefore be avoided by means of the housing body. By way of example, the housing body is opaque to radiation. In this case, "opaque to radiation" means that the housing body is opaque to electromagnetic radiation impinging on it at least to the extent of 80%, preferably to the extent of more than 90%. The housing body can be formed with a thermosetting plastic material or a thermoplastic material, for example an epoxide, or else can be formed with a ceramic material, or can consist of such a material. Radiation-absorbing materials, for example carbon black particles or other fillers, can additionally be introduced into the material. The housing body can then appear black or colored to an external observer.

In accordance with at least one embodiment, the carrier is embedded into the housing body at least in places. That can mean that the carrier is enclosed by the housing body apart from places at which the connection places are arranged at the carrier and also a connection region for the optoelectronic element at the top side of the carrier in the region of the mounting region. By way of example, the housing body surrounds the connection places of the semiconductor element in a positively locking manner at least in places. The area at the underside of the carrier can then be covered by the housing body in places. By way of example, the connection places terminate vertically flush with the housing body. That is to say that the connection places are situated at the underside of the carrier and do not project beyond the housing body. It is likewise conceivable for the area at the underside of the carrier to be completely free of the housing body. At least at the connection areas, the connection places are not surrounded by the housing body.

In accordance with at least one embodiment, at least one side area of the semiconductor component is produced by means of singulation, wherein the side area is formed by an outer area of the oxidation region at least in places. The at least one side area of the semiconductor component delimits the semiconductor component in a lateral direction, that is to say laterally. By way of example, the side area runs perpendicular to the area at the underside and/or the top side of the carrier. In particular, contour shapes of the side area are therefore not produced by a molding or pressing process, but rather by means of a singulation process at least of the carrier. The singulation can be effected for example by means of sawing, cutting, milling or producing a breaking edge and subsequent breaking. The side area of the semiconductor component is thus produced by means of material removal. The side area then preferably has traces of a material removal. If the production of the semiconductor component involves singulating, cutting or breaking both through the housing body and through the oxidation region of the carrier, then the outer area of the oxidation region terminates laterally flush with an outer area of the housing body. The side area is then formed both in places by the outer area of the housing body and in places by the outer area of the carrier.

In accordance with at least one embodiment, at least one side area of the semiconductor component is produced by means of singulation, wherein the side area is formed only by an outer area of the mounting region and/or an outer area of the connection region. In this context, "only" means that the side area is not formed with the outer area of the oxidation region. In particular, that can mean that the side area can be formed both by an outer area of the mounting region and/or an outer area of the connection region and by the outer area of the housing body.

BRIEF DESCRIPTION OF THE DRAWINGS

The optoelectronic semiconductor component described here and a method for producing said optoelectronic semiconductor component are explained in greater detail below on the basis of exemplary embodiments and the associated figures.

In the exemplary embodiments and the figures, identical or identically acting constituent parts are in each case provided with the same reference signs. The elements illustrated should not be regarded as true to scale; rather, individual elements may be illustrated with an exaggerated size in order to afford a better understanding.

DETAILED DESCRIPTION OF ILLUSTRATIVE EMBODIMENTS

Figure 1A:
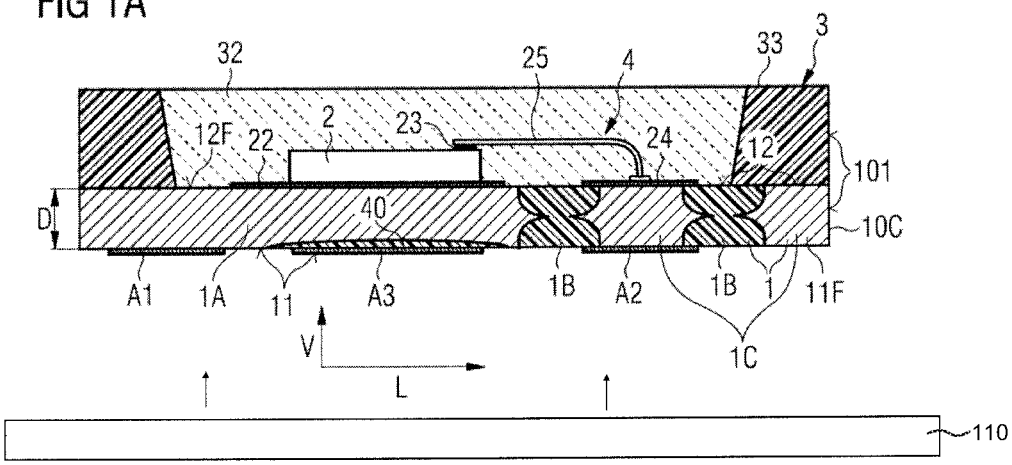
FIG. 1A shows in a schematic side view an exemplary embodiment of an optoelectronic semiconductor component described here.

FIG. 1A shows in a schematic sectional view an optoelectronic semiconductor component 100 described here comprising a carrier 1 having a top side 12 and an underside 11 situated opposite the top side 12. The carrier 1 is formed with an electrically conductive mounting region 1A, an electrically conductive connection region 1C and also an electrically insulating oxidation region 1B. In the mounting region 1A, an optoelectronic element 2 is applied to an area 12F at the top side 12 of the carrier 1, wherein an electrically conductive contact layer 22 is arranged between the carrier 1 and the optoelectronic element 2 for the purpose of making contact with the optoelectronic element 2.

Furthermore, connection places A1 and A2 are arranged onto an area 11F at the underside 11 of the carrier 1 in the mounting region 1A and in the connection region 1C and are applied to the area 11F. Moreover, a contact area 23 is applied to an outer area of the optoelectronic element 2 facing away from the carrier 1. By means of a bonding wire contact-connection 25, the contact area 23 is electrically conductively connected to a further contact area 24 applied to the area 12F at the top side 12 of the carrier 1 in the connection region 1B.

Both the mounting region 1A and the connection region 1C are completely formed with an aluminum 10, wherein the oxidation region 1B is formed with an oxide 15 of the aluminum 10. In this case, the oxidation region 1B extends without interruption from the top side 12 of the carrier 1 toward the underside 11 of the carrier 1. In other words, the oxidation region 1B is embodied in a contiguous and continuous fashion in a vertical direction V. The mounting region 1A, the oxidation region 1B and the connection region 1C form one unit and are likewise embodied in a contiguous fashion. A thickness D of the carrier is at least 0.1 mm and at most 0.4 mm, for example 0.2 mm.

The carrier 1 is embedded into a housing body 3 in places. That is to say that the carrier 1, via its area 12F at the top side 12, is in direct contact with the housing body 3 in places. The housing body 3 completely covers the area 12F apart from a connection region of the area 12F at the top side 12 of the carrier 1. The housing body 3 and the area 12F at the top side 12 of the carrier 1 define a cavity 32 in which the optoelectronic element 2 is arranged. In this case, the housing body 3 completely borders the optoelectronic element 2 in a lateral direction L.

In the present case, a potting 4 is introduced into the cavity 32 and covers all exposed places of the optoelectronic element 2. Preferably, the potting 4 is formed with a radiation-transmissive potting material, such as, for example, a silicone, an epoxide or a mixture composed of a silicone or an epoxide. In this context, "radiation-transmissive" means that the potting material of the potting 4 is transmissive to electromagnetic radiation emitted by the optoelectronic element 2 at least to the extent of 80%, preferably to the extent of more than 90%. By way of example, the potting 4 is introduced into the cavity 32 by means of potting, molding or jetting. It is also conceivable for fillers such as, for example, a luminescence conversion material and/or a filter material to be introduced into the radiation-transmissive potting material.

By way of example, radiation-reflecting particles are introduced into the potting material proceeding from the area 12F of the carrier 1 up to the height of a radiation passage area of the optoelectronic element 2. Upward to this filling height, the potting 4 is then embodied in a radiation-reflecting fashion. Likewise, the cavity 32 can also be filled with the radiation-reflecting potting 4 only up to the height of the radiation passage area. By way of example, the radiation-reflecting particles are formed with at least one of the materials $TiO_2$, $BaSO_4$, $ZnO$, $Al_xO_y$, or contain at least one of the materials. The potting 4 can then appear white to an external observer.

The connection places A1 and A2 applied on the area 11F at the underside 11 of the carrier 1 do not project beyond the carrier 1 in the lateral direction L. In particular, the optoelectronic semiconductor component 100 shown in FIG. 1A is surface-mountable. Furthermore, the optoelectronic component 100 comprises a further oxidation region 40, which is formed at the underside 11 of the carrier 1 in the mounting region 1A. In this case, the further oxidation region 40 does not completely form the carrier 1 at any place in the vertical direction V. In the present case, the further oxidation region 40 is introduced into the carrier 1 from outside from the underside 11 and forms an edge region of the carrier 1 at the underside 11. In other words, the area 11F at the underside 11 is formed in places by an outer area of the oxidation region 40. A contact element A3, for example a soldering pad, is applied to the area 11F in the region of the oxidation region 40, and is electrically insulated from the rest of the carrier 1 by the oxidation region 40. By way of example, the contact element A3 serves for fixing the semiconductor component 100 on a contact carrier 110. By way of example, the semiconductor component 100 is mechanically fixed by means of soldering on such a contact carrier 110 via the contact element A3.

A side area 101 of the semiconductor component 100 is produced by means of singulation. FIG. 1A illustrates that the side area 101 is formed by an outer area 33 of the housing body 3 and an outer area 10C of the connection region 1C.

Figure 1B:
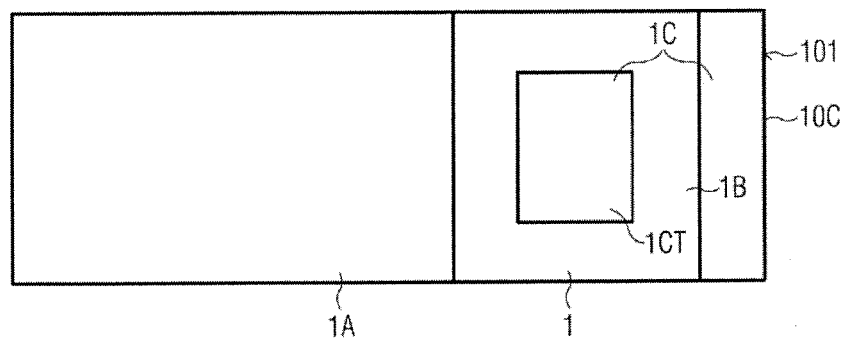
FIGS. 1B to 1E show in schematic plan views exemplary embodiments of a carrier described here.
Figure 1C:
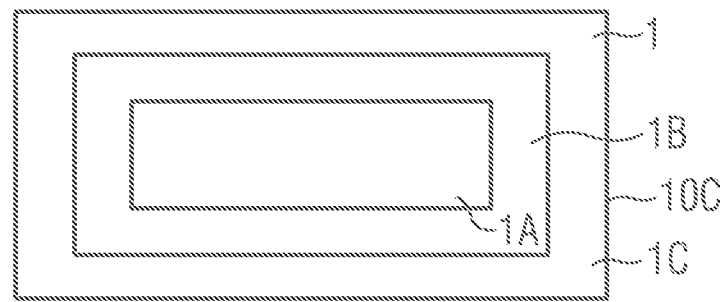
Figure 1D:
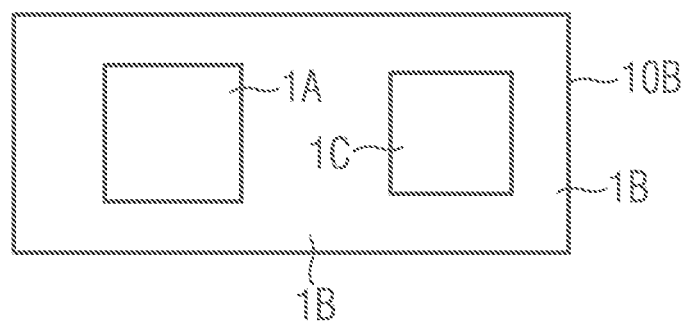

FIGS. 1B to 1D show in schematic plan views a carrier 1 described here.

FIG. 1B shows the carrier 1 from FIG. 1A. It can be gathered from FIG. 1B that the oxidation region 1B completely borders a partial region 1CT of the connection region 1C and encloses it in the lateral direction L. With respect to the entire connection region 1C, the oxidation region 1B borders the connection region only in places. In this case, the oxidation region 1B spaces apart the partial region 1CT from the mounting region 1A in a lateral direction L.

In the case of the carrier 1 in FIG. 1C, the connection region 1C borders both the oxidation region 1B and the mounting region 1A completely, that is to say in a frame-shaped fashion, wherein the mounting region 1A is additionally bordered completely by the oxidation region 1B.

FIG. 1D shows that the oxidation region 1B borders both the mounting region 1A and the connection region 1C completely in a lateral direction L. In this case, FIG. 1D shows an outer area 10B which can form the side area 101 of the semiconductor component 100, for example together with the outer area 33 of the housing body 3.

Figure 1E:
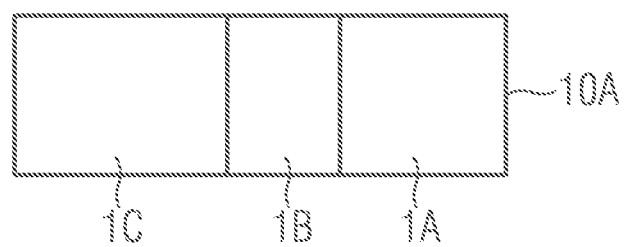

In FIG. 1E, the mounting region 1A, the oxidation region 1B and the connection region 1C are embodied in the form of strips and arranged alongside one another in the lateral direction L. That is to say that the oxidation region 1B spaces apart the mounting region 1A from the connection region 1C in a lateral direction L and the individual regions succeed one another in a lateral direction L. In this case, FIG. 1E shows an outer area 10A which can form the side area 101 of the semiconductor component 100, for example together with the outer area 33 of the housing body 3.

FIGS. 2A to 2F show in schematic views individual manufacturing steps for producing an optoelectronic semiconductor component 100 described here. That is to say that all features disclosed in conjunction with the semiconductor component 100 described here are also disclosed for the method, and vice versa.

Figure 2A:
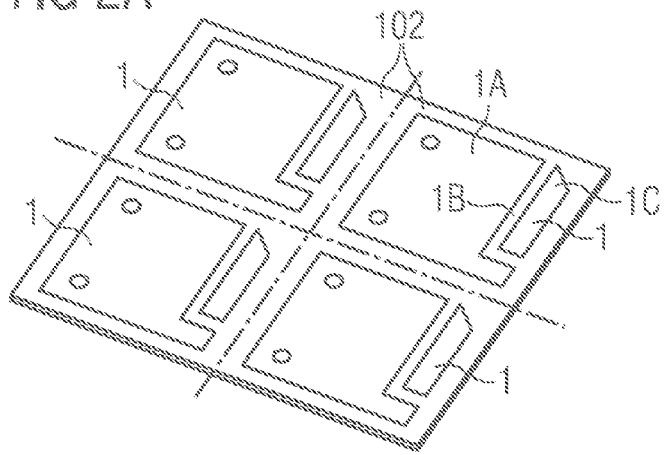
FIGS. 2A to 2F show individual manufacturing steps for producing an optoelectronic semiconductor component described here.

FIG. 2A illustrates a carrier assemblage 102 formed by a multiplicity of carriers 1 described here which are arranged in a matrix-like fashion.

Figure 2B:
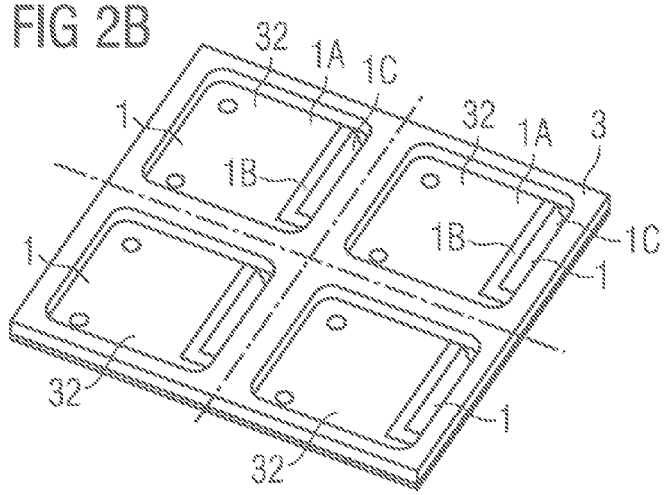

FIG. 2B illustrates how, in a next step, the housing body 3 is in each case applied to the area 12F at the top side 12 of the carrier 1.

Figure 2C:
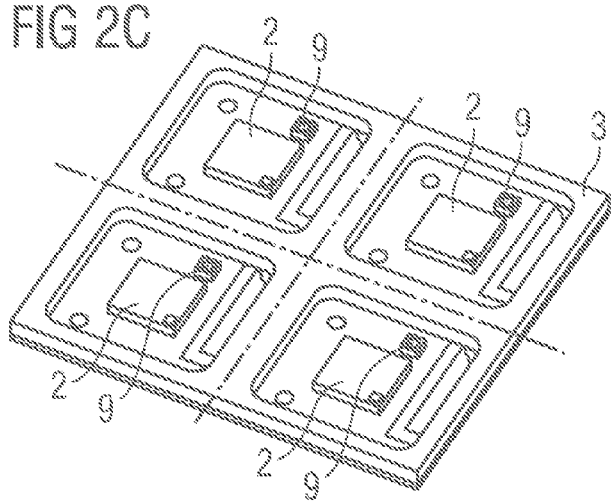

In a next step, FIG. 2C illustrates how the optoelectronic element 2 is applied to the area 12F at the top side 12 of each carrier 1 in the region of the mounting region 1A. Furthermore, it can be gathered from FIG. 2C that an electronic element 9 is likewise arranged in the same region on the area 12F at the top side 12 on the carrier 1. By way of example, the electronic element 9 contains or is a protective circuit against damage caused by electrostatic charging (also referred to as an ESD protective circuit).

Figure 2D:
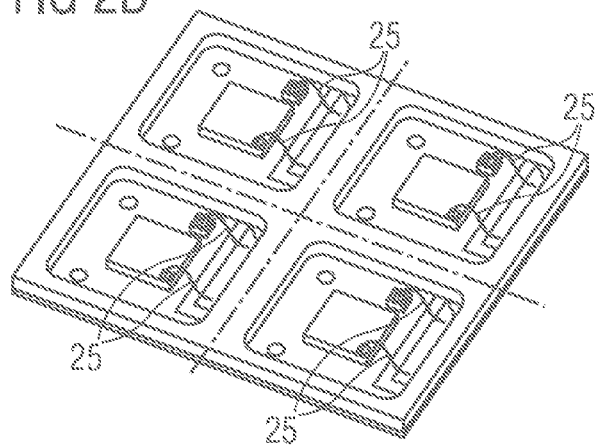

FIG. 2D illustrates how electrical contact is made with both the optoelectronic element 2 and the electronic element 9 with the connection region 1C by means of the bonding wire contact-connection 25.

Figure 2E:
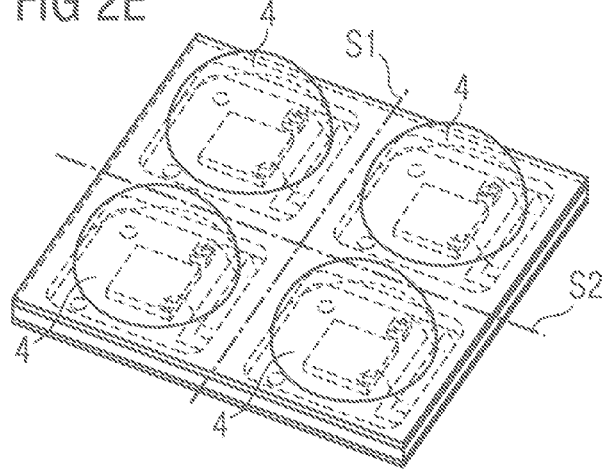

FIG. 2E illustrates a further step, wherein a radiation-transmissive potting 4 is in each case introduced into the cavity 32, wherein an outer area of the radiation-transmissive potting 4 facing away from the optoelectronic element 2 is embodied as convex, for example in a lens-shaped fashion, in places with respect to the optoelectronic element 2. The radiation-transmissive potting 4 completely covers all exposed places of the optoelectronic element 2 and completely fills the cavity 32.

Figure 2F:
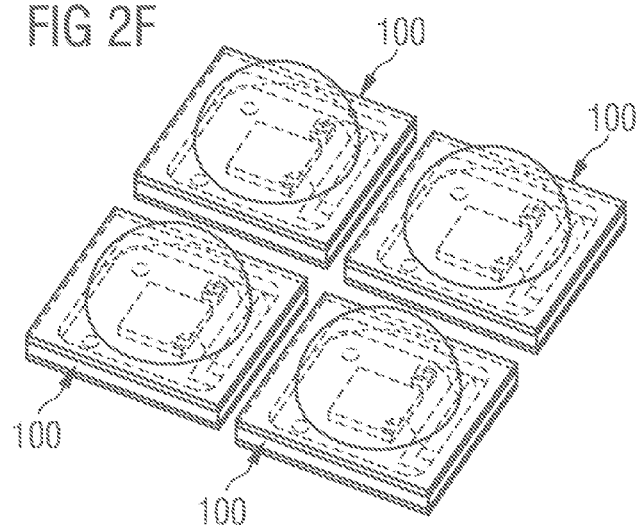

FIG. 2F illustrates a next step, wherein the carrier assemblage 102 is singulated along singulation lines S1 and S2 and individual optoelectronic semiconductor components 100 are thus produced.

The invention is not restricted by the description on the basis of the exemplary embodiments. Rather, the invention encompasses any novel feature and also any combination of features, which in particular includes any combination of features in the patent claims, even if this feature or this combination itself is not explicitly specified in the patent claims or in the exemplary embodiments.

The invention claimed is:

1. An optoelectronic semiconductor component, comprising:
    a carrier having a top side and an underside located opposite the top side, wherein the carrier includes an electrically conductive mounting region, an electrically conductive connection region and an electrically insulating oxidation region;
    an optoelectronic element arranged at the top side of the carrier at the mounting region;
    wherein the oxidation region electrically insulates the mounting region from the connection region;
    wherein the oxidation region extends without interruption from the top side of the carrier toward the underside of the carrier;
    wherein the mounting region and the connection region comprise aluminum;
    wherein the oxidation region comprise an oxide of the aluminum; and
    wherein the mounting region, the oxidation region and the connection region are embodied in a contiguous fashion and form one unit;
    wherein the carrier further comprises a further oxidation region located at the underside of the carrier near the mounting region and/or in the region of the connection region and wherein the carrier comprises a contact element configured to fix the optoelectronic semiconductor component on an external contact carrier;
    wherein the further oxidation region does not completely form the carrier at any place in a vertical direction, the vertical direction being aligned perpendicular to a main extension direction of the carrier; and
    wherein the further oxidation region does not form a unit with the oxidation region of the carrier and wherein the further oxidation region is applied between the contact element and the mounting region along the vertical direction and wherein the contact element is electrically insulated from the mounting region by the further oxidation region.

2. The optoelectronic semiconductor component according to claim 1, wherein the oxidation region is arranged at least in places between the mounting region and the connection region in a lateral direction.

3. The optoelectronic semiconductor component according to claim 1, wherein the oxidation region borders the mounting region and/or the connection region at least in places.

4. The optoelectronic semiconductor component according to claim 1, wherein the mounting region and/or the connection region border(s) the oxidation region at least in places.

5. The optoelectronic semiconductor component according to claim 1, wherein a thickness of the carrier is at least 0.1 mm and at most 0.4 mm.

6. The optoelectronic semiconductor component according to claim 1, further comprising connection places arranged at the underside of the carrier in the mounting region and in the connection region.

7. The optoelectronic semiconductor component according to claim 6, wherein the connection places do not project beyond the carrier in a lateral direction.

8. The optoelectronic semiconductor component according to claim 1, further comprising a housing body that covers the carrier at least in places.

9. The optoelectronic semiconductor component according to claim 8, wherein the carrier is embodied into the housing body at least in places.

10. The optoelectronic semiconductor component according to claim 1, wherein at least one side area of the optoelectronic semiconductor component is produced by singulation.

11. The optoelectronic semiconductor component according to claim 10, wherein the side area is formed by an outer area of the oxidation region at least in places.

12. The optoelectronic semiconductor component according to claim 10, wherein the side area is formed only by an outer area of the mounting region and/or an outer area of the connection region.

13. The optoelectronic semiconductor component according to claim 1, further comprising a second optoelectronic component arranged at the top side of the carrier at the mounting region.

14. The optoelectronic semiconductor component according to claim 1, wherein a width of the oxidation region varies along the vertical direction, so that a minimal width, in a direction perpendicular to the vertical direction, of the oxidation region is located within the carrier.

* * * * *